(12) United States Patent
Chen

(10) Patent No.: US 11,418,058 B2
(45) Date of Patent: Aug. 16, 2022

(54) WIRELESS CHARGING SYSTEM, METHOD FOR DETERMINING CHARGING REGION, ELECTRONIC DEVICE, AND COMPUTER-READABLE STORAGE MEDIUM

(71) Applicant: BEIJING XIAOMI MOBILE SOFTWARE CO., LTD., Beijing (CN)

(72) Inventor: Chaoxi Chen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 239 days.

(21) Appl. No.: 16/809,208

(22) Filed: Mar. 4, 2020

(65) Prior Publication Data

US 2021/0111588 A1 Apr. 15, 2021

(30) Foreign Application Priority Data

Oct. 10, 2019 (CN) .......................... 201910959250.0

(51) Int. Cl.
*H02J 50/00* (2016.01)
*H02J 50/12* (2016.01)

(52) U.S. Cl.
CPC ............ *H02J 50/005* (2020.01); *H02J 50/12* (2016.02)

(58) Field of Classification Search
CPC .......... H02J 50/005; H02J 50/12; H02J 50/90; H02J 50/10; G01R 33/00; H04W 4/021; H04W 4/026
See application file for complete search history.

(56) References Cited

U.S. PATENT DOCUMENTS 5,047,720 A * 9/1991 Guy .................... G01R 33/3873
324/320
6,760,678 B1 * 7/2004 Hon ........................ G01C 17/28
33/356
(Continued)

FOREIGN PATENT DOCUMENTS

CN 103884326 A 6/2014
CN 110649719 A * 1/2020 .............. H02J 50/10

OTHER PUBLICATIONS

Extended European Search Report dated Aug. 21, 2020 in European Patent Application No. 20167889.3, 9 pages.

*Primary Examiner* — Stacy Whitmore
(74) *Attorney, Agent, or Firm* — Oblon, McClelland, Maier & Neustadt, L.L.P.

(57) ABSTRACT

The disclosure relates to a wireless charging system, a determining method and device for a charging region, and an electronic device. The wireless charging system can include a wireless charging base and an electronic device. The wireless charging base includes a cylindrical magnet disposed axially along a thickness of the wireless charging base. The electronic device includes a charging coil component, a compass sensor which is configured to detect magnetic field intensities of a magnetic field generated by the cylindrical magnet in a first direction and in a second direction. The first direction is an axial direction of the cylindrical magnet and is perpendicular to the second direction. The electronic device further includes a processor configured to determine, according to the magnetic field intensities in the first direction and in the second direction, a charging region formed by the cylindrical magnet and adapted to the charging coil component.

9 Claims, 7 Drawing Sheets

(56) References Cited

U.S. PATENT DOCUMENTS

| | | | |
|---|---|---|---|
| 2005/0115090 A1* | 6/2005 | Yano | G01C 21/20 33/355 R |
| 2007/0055468 A1* | 3/2007 | Pylvanainen | G01P 15/18 702/92 |
| 2009/0251113 A1* | 10/2009 | Raghuprasad | A47J 43/046 322/39 |
| 2011/0050164 A1* | 3/2011 | Partovi | H02J 7/00304 320/108 |
| 2012/0146576 A1* | 6/2012 | Partovi | H02J 50/90 320/108 |
| 2013/0119928 A1* | 5/2013 | Partovi | H02J 7/00 320/108 |
| 2013/0221910 A1* | 8/2013 | Kim | H02J 5/005 320/108 |
| 2013/0229078 A1* | 9/2013 | Garber | H02K 7/025 310/90.5 |
| 2013/0237255 A1* | 9/2013 | Shinada | H04W 4/026 455/456.6 |
| 2014/0191717 A1* | 7/2014 | Hong | H02J 7/0042 320/108 |
| 2015/0022020 A1 | 1/2015 | Borngräber | |
| 2015/0022194 A1 | 1/2015 | Almalki et al. | |
| 2016/0003270 A1* | 1/2016 | Franklin | H01F 7/0221 439/529 |
| 2016/0172891 A1* | 6/2016 | Filippenko | H02J 50/12 320/108 |
| 2016/0380488 A1* | 12/2016 | Widmer | H04B 5/0037 324/207.15 |
| 2017/0018953 A1* | 1/2017 | Yamaguchi | H01Q 1/38 |
| 2017/0343349 A1* | 11/2017 | Han | G01R 33/0035 |
| 2018/0052649 A1* | 2/2018 | Patel | G06F 3/1423 |
| 2018/0248406 A1* | 8/2018 | Bae | H02J 7/025 |
| 2018/0272139 A1* | 9/2018 | Stouffer | A61N 1/37235 |
| 2018/0353215 A1* | 12/2018 | Cheng | A61B 17/7216 |
| 2019/0020226 A1* | 1/2019 | Huang | H02J 7/0042 |
| 2019/0080840 A1* | 3/2019 | Budhia | H01F 27/36 |
| 2019/0097448 A1* | 3/2019 | Partovi | H02J 7/00308 |
| 2019/0198212 A1* | 6/2019 | Levy | B62J 50/225 |
| 2019/0312460 A1* | 10/2019 | Van Boheemen | B60L 53/12 |
| 2019/0337393 A1* | 11/2019 | Von Novak, III | B60L 53/39 |
| 2020/0006966 A1* | 1/2020 | Lu | H02J 7/0044 |
| 2020/0021144 A1* | 1/2020 | Budhia | H01F 27/36 |
| 2020/0139462 A1* | 5/2020 | Chen | B23D 59/006 |
| 2020/0153276 A1* | 5/2020 | Ahmad Mughal | H02J 50/90 |
| 2020/0247257 A1* | 8/2020 | Ming | B60L 53/12 |
| 2020/0303968 A1* | 9/2020 | Huang | H02J 50/80 |
| 2021/0111588 A1* | 4/2021 | Chen | H02J 50/10 |
| 2021/0221244 A1* | 7/2021 | Kuhr | B60L 53/38 |
| 2021/0305825 A1* | 9/2021 | Zheng | H02J 50/10 |
| 2021/0333296 A1* | 10/2021 | Benelmekki Erretby | G01N 35/0098 |
| 2021/0367032 A1* | 11/2021 | Chen | H01L 29/66795 |

* cited by examiner

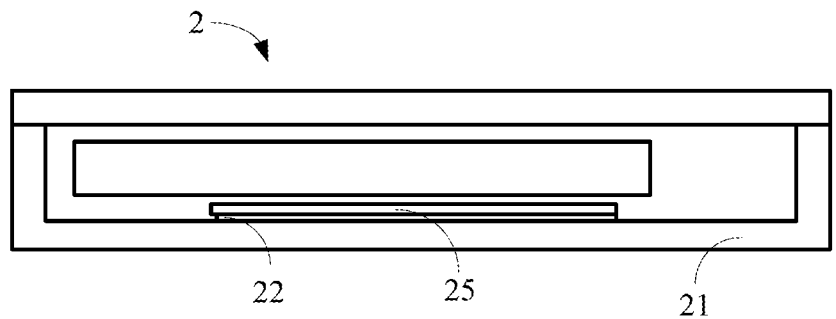

FIG. 5

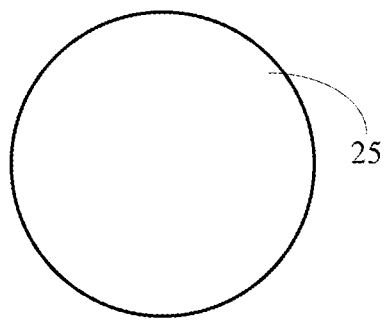

FIG. 6

| Acquire an intensity of a magnetic field generated by a cylindrical magnet in a first direction and a second direction respectively, wherein the first direction is an axial direction of the cylindrical magnet, and the second direction is perpendicular to the first direction | 601 |
|---|---|

| Determine, according to the intensity of the magnetic field in the first direction and the second direction respectively, a charging region formed by the cylindrical magnet and adapted to the charging coil component, wherein a point where the intensity of the magnetic field is zero in the first direction is taken as a first point, a point where the intensity of the magnetic field is zero in the second direction is taken as a second point, and the charging region is a circular region with the second point as a center of a circle, with a distance between the first point and the second point as a radius, and passing through the first point | 602 |
|---|---|

FIG. 7

WIRELESS CHARGING SYSTEM, METHOD FOR DETERMINING CHARGING REGION, ELECTRONIC DEVICE, AND COMPUTER-READABLE STORAGE MEDIUM

CROSS-REFERENCE TO RELATED APPLICATIONS

This application is based upon and claims priority to Chinese Patent Application 201910959250.0, filed on Oct. 10, 2019, the entire contents of which are incorporated herein by reference.

TECHNICAL FIELD

The disclosure relates to the technical field of terminals, and particularly relates to a wireless charging system, a method for determining a charging region, electronic devices, and a computer-readable storage medium.

BACKGROUND

Currently, with increasing maturity of the technologies of electronic devices, such as mobile phones or tablets, the market has put forward higher requirements on the convenience of the electronic devices. In order to solve the problems encountered when charging for an electronic device, such as any inconvenience that can be caused due to the restriction by a wire and that the wire can be easy to lose, researchers have developed wireless charging technology. Wireless charging may be realized through cooperation between a wireless charging base and the electronic device.

SUMMARY

In the disclosure, a wireless charging system, a method for determining a charging region, electronic devices, and a computer-readable storage medium are provided to solve the shortcomings of wireless charging.

According to a first aspect of embodiments of the disclosure, provided is an electronic device cooperating with a wireless charging base to charge the electronic device wirelessly. The wireless charging base can include a cylindrical magnet, where the electronic device can include a charging coil component, and a compass sensor configured to detect magnetic field intensities of a magnetic field generated by the cylindrical magnet in a first direction and a second direction. The first direction is an axial direction of the cylindrical magnet, and the second direction is perpendicular to the first direction. The electronic device can further include a processor that is configured to determine, according to the magnetic field intensities in the first direction and the second direction detected by the compass sensor, and a charging region adapted to the charging coil component. A point, at which the magnetic field intensity is zero in the first direction, is taken as a first point, a point, at which the magnetic field intensity is zero in the second direction, is taken as a second point, and the charging region is a circular region with the second point as a center of a circle, with a distance between the first point and the second point as a radius, and passing through the first point.

According to a second aspect of embodiments of the disclosure, provided is a method for determining a charging region, applied to an electronic device cooperating with a wireless charging base to charge the electronic device wirelessly through the wireless charging base. The wireless charging base in can include a cylindrical magnet disposed axially along a thickness of the wireless charging base, and the electronic device can include a charging coil component. The method can include acquiring magnetic field intensities of a magnetic field generated by the cylindrical magnet in a first direction and a second direction. The first direction is an axial direction of the cylindrical magnet and the second direction is perpendicular to the first direction. The method can further include determining, according to the magnetic field intensities in the first direction and the second direction, a charging region formed by the cylindrical magnet and adapted to the charging coil component. A point, at which the magnetic field intensity is zero in the first direction, is taken as a first point, a point, at which the magnetic field intensity is zero in the second direction, is taken as a second point, and the charging region is a circular region with the second point as a center of a circle, with a distance between the first point and the second point as a radius, and passing through the first point.

According to a third aspect of embodiments of the disclosure, provided is an electronic device that can include a processor, and a memory configured to store processor-executable instructions, wherein the processor, when in execution, is configured to acquire magnetic field intensities of a magnetic field generated by a cylindrical magnet in a first direction and a second direction. The first direction is an axial direction of the cylindrical magnet, and the second direction is perpendicular to the first direction. Further, the processor can determine, according to the magnetic field intensities in the first direction and the second direction, a charging region adapted to a charging coil component. A point, at which the magnetic field intensity is zero in the first direction, is taken as a first point, a point, at which the magnetic field intensity is zero in the second direction, is taken as a second point, and the charging region is a circular region with the second point as a center of a circle, with a distance between the first point and the second point as a radius, and passing through the first point.

According to a fourth aspect of embodiments of the disclosure, provided is a wireless charging system that can include an electronic device according to the first aspect of embodiments of the disclosure. The wireless charging system can further include a wireless charging base configured to charge the electronic device wirelessly, wherein the wireless charging base includes a cylindrical magnet disposed axially along a thickness of the wireless charging base.

According to a fifth aspect of embodiments of the disclosure, provided is a computer-readable storage medium with computer instructions stored thereon, wherein the instructions, when executed by a processor, implement the steps of the method of any one of the above embodiments.

It should be understood that the general description above and the detailed description hereinafter are merely exemplary and explanatory, but do not limit the disclosure.

BRIEF DESCRIPTION OF THE DRAWINGS

The accompanying drawings incorporated herein and constituting part of the specification illustrate embodiments consistent with the disclosure and, together with the specification, serve to explain the principles of the disclosure.

FIG. 5 illustrates a schematic cross-sectional diagram of an electronic device according to an exemplary embodiment.

FIG. 6 illustrates a schematic structural diagram of a magnetism isolation sheet according to an exemplary embodiment.

FIG. 7 illustrates a flow chart of a determining method for a charging region according to an exemplary embodiment.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with aspects related to the disclosure as recited in the appended claims.

The terms used in the disclosure are adopted for the purpose of describing specific embodiments only, and are not intended to limit this application. The singular forms "a/an", "said" and "the" used in the disclosure and the appended claims may further include plural forms unless the contexts clearly indicate other meanings. It should further be understood that the term "and/or" used herein refers to and includes any or all possible combinations of one or more of the associated listed items.

It should be understood that although the terms "first", "second" and "third" may be employed in the disclosure to describe various information, the information should not be limited to these terms. These terms are only used to distinguish the same type of information from one another. For example, "first information" may also be referred to as "second information" without departing from the scope of this application. Similarly, "second information" may also be referred to as "first information". Depending on the context, the word "if" as used herein may be interpreted as "when" or "while" or "in response to determining that".

Figure 1:
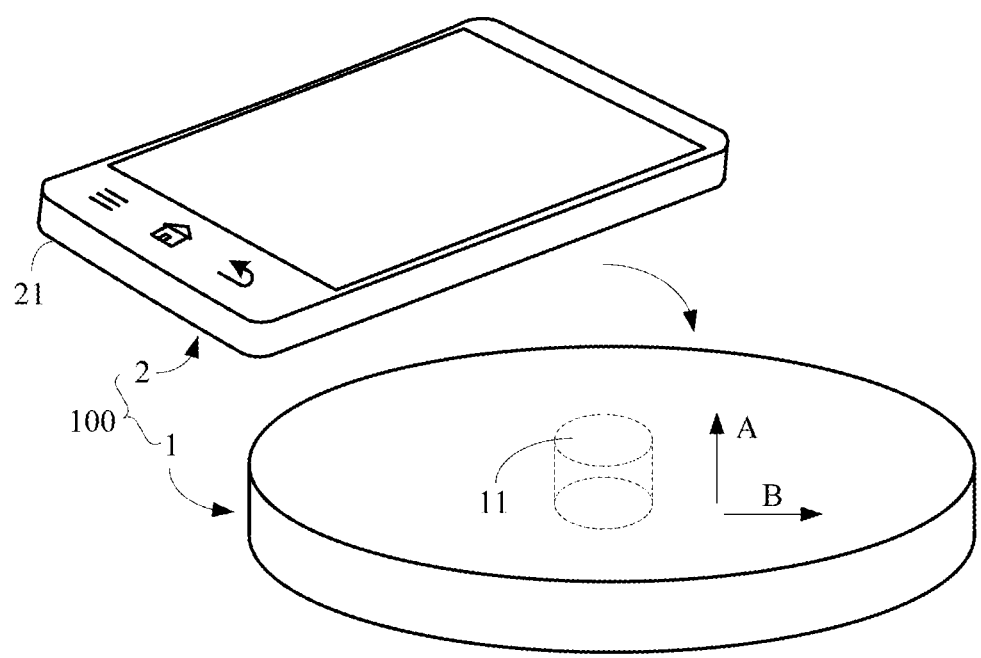
FIG. 1 illustrates a schematic structural diagram of a wireless charging system according to an exemplary embodiment.

FIG. 1 illustrates a schematic structural diagram of a wireless charging system 100 according to an exemplary embodiment. As illustrated in FIG. 1, the wireless charging system 100 may include a wireless charging base 1 and an electronic device 2 cooperating with the wireless charging base 1, so as to charge a battery in the electronic device 2 wirelessly via the interaction between the wireless charging base 1 and the electronic device 2. The wireless charging base 1 may include a cylindrical magnet 11. The cylindrical magnet 11 may be disposed axially along a thickness of the wireless charging base 1.

Figure 2:
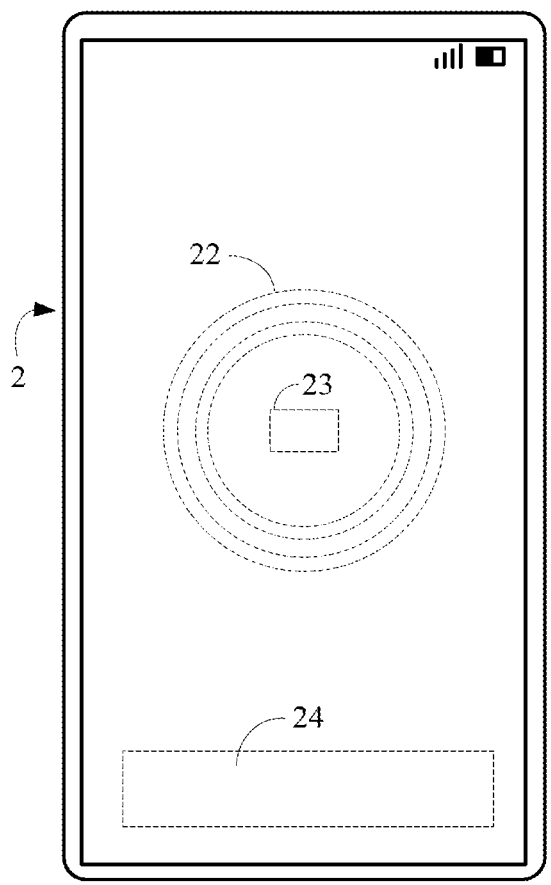
FIG. 2 illustrates a schematic structural diagram of an electronic device according to an exemplary embodiment.

As shown in FIG. 2, the electronic device 2 may include a charging coil component 22 and a compass sensor 23. The compass sensor 23 may be configured to detect magnetic field intensities of a magnetic field generated by the cylindrical magnet 11 in a first direction (that is, a direction denoted by an arrow A in FIG. 1) and a second direction (that is, a direction denoted by an arrow B in FIG. 1). The first direction is an axial direction of the cylindrical magnet 11. The second direction is perpendicular to the first direction. The second direction may coincide with any radial direction of the cylindrical magnet 11, which will not be specified in the disclosure.

The electronic device 2 may further include a processor 24. The processor 24 may communicate with the compass sensor 23 to acquire data detected by the compass sensor 23. Specifically, the processor 24 may be configured to determine, according to the magnetic field intensities of the magnetic field in the first direction A and the second direction B detected by the compass sensor 23, a charging region formed by the cylindrical magnet 11 and adapted to the charging coil component 22. Specifically, a point, at which the magnetic field intensity is zero in the first direction A, may be taken as a first point, and a point, at which the magnetic field intensity is zero in the second direction B, may be taken as a second point.

The charging region is a circular region with the second point as a center of a circle, with a distance between the first point and the second point as a radius, and passing through the first point. When a user holds and moves the electronic device 2 to align the internal charging coil component 22 with the circular region, the electronic device 2 can be charged. Specifically, an indication lamp may be provided on the electronic device 2 to indicate the user that the electronic device 2 is already aligned with the wireless charging base 1. Alternatively, a charging indication mark may be displayed on a display interface of the electronic device 2 to prompt the user, which will not be specified in the disclosure.

The circular region formed by the cylindrical magnet 11 will be described in detail in FIG. 3. As shown, with respect to the relative position between the cylindrical magnet 11 and the wireless charging base 1, it is assumed that a north magnetic pole of the cylindrical magnet 11 is closer to a surface, for placing the electronic device 2, of the wireless charging base 1, and a south magnetic pole of the cylindrical magnet is closer to a bottom surface of the wireless charging base 1. When placed on the surface of the wireless charging base 1, the electronic device 2 will be in a magnetic field above the cylindrical magnet 11, that is, in a magnetic field closer to the north magnetic pole.

Figure 3:
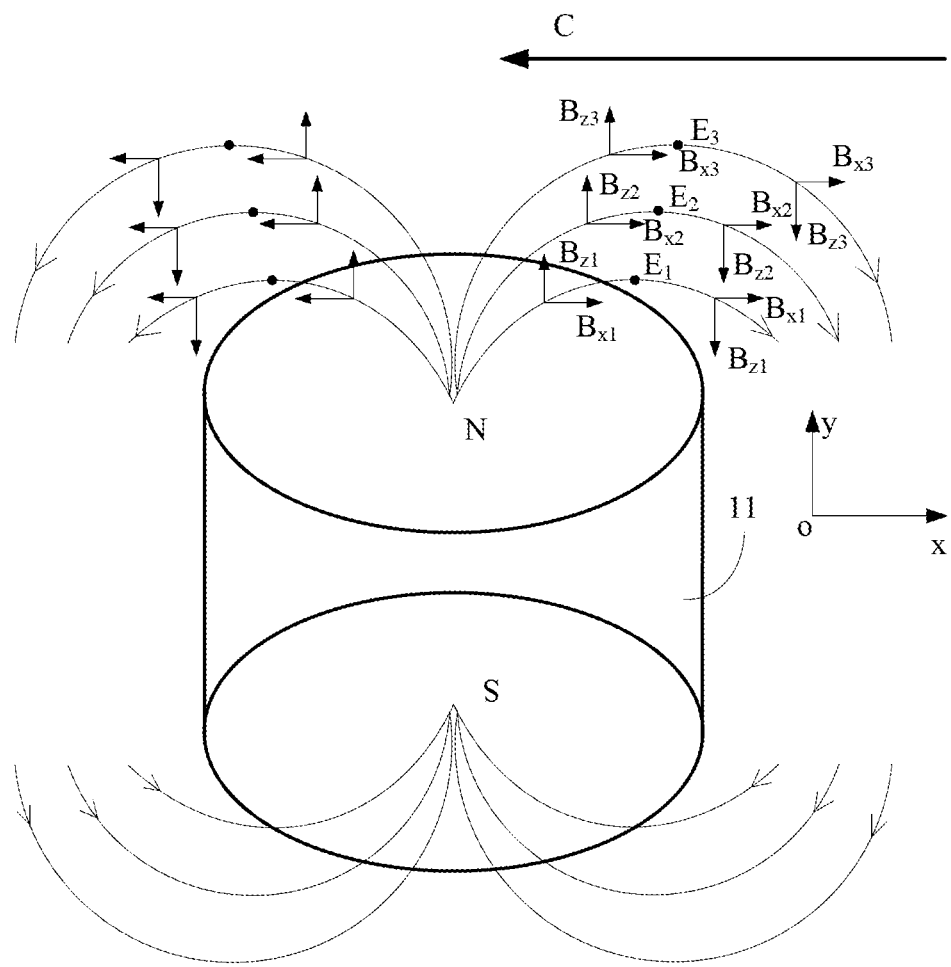
FIG. 3 illustrates a schematic diagram of a magnetic field of a cylindrical magnet according to an exemplary embodiment.

Further, still as illustrated in FIG. 3, an axis of the cylindrical magnet 11 is taken as a boundary, magnetic induction lines formed in a radial direction located at two sides of the axis are taken as an example. For instance, in FIG. 3, magnetic induction lines L1, L2, and L3 are formed at the right of the cylindrical magnet 11, and magnetic induction lines L4, L5, and L6 are formed at the left of the cylindrical magnet 11. With the magnetic induction line L1 and a coordinate system xoy as an example, at the end of the magnetic induction line L1 closer to the north magnetic pole, an intensity $B_{z1}$ of the magnetic field in a first direction A that can be detected by the compass sensor 23 is positive. As gradually moving away from the north magnetic pole, the magnetic field intensity in the first direction A that can be detected by the compass sensor 23 gradually decreases. Until the magnetic field intensity in the first direction A is detected to be zero at a point $E_1$. As further moving away from the north magnetic pole, the intensity $B_{z1}$ of the magnetic field in the first direction A that can be detected by the compass sensor 23 is negative. In this way, the compass sensor 23 can determine the edge of the charging region according to the change in the direction of the detected magnetic field intensity. Similarly, by detecting the magnetic induction line L2, it can be determined that the intensity $B_{z2}$ of the magnetic field is zero at $E_2$, is positive at the left of $E_2$, and is negative at the right of $E_2$. By detecting the magnetic induction line L3, it can be determined that the intensity $B_{z3}$ of the magnetic field is zero at $E_3$, is positive at the left of the $E_3$, and is negative at the right of the $E_3$. Of course, when the direction of the coordinate system xoy is changed, the positive and negative property of the detected magnetic field intensity may be changed correspondingly, which will not be specified in the disclosure.

Further, it is assumed that the electronic device 2 moves in a direction denoted by an arrow C, after being placed on the wireless charging base 1. At the right of the cylindrical magnet 11, the magnetic field intensity, detected by the compass sensor 23, on the magnetic induction lines L1, L2 and L3 are all positive. At the left of the cylindrical magnet, the magnetic field intensity, detected by the compass sensor 23, on the magnetic induction lines L1, L2 and L3 are all negative. Therefore, the compass sensor 23 or the processor 34 can determine a center of a circle for a charging region according to the change in the direction of the detected magnetic field intensity.

It can be understood that when the spaced distance between the compass sensor 23 and the cylindrical magnet 11 is different, the spaced distance between the first point and the second point will also be different. Specifically, the spaced distance between the compass sensor 23 and the cylindrical magnet 11 is inversely related with the spaced distance between the first point and the second point. That is to say, the larger the spaced distance between the compass sensor 23 and the cylindrical magnet 11, the smaller the corresponding charging region will be. It can be seen that, according to the technical solution of the disclosure, a corresponding charging region can be determined for a different electronic device 2, improving the efficiency of a charging process.

Figure 4:
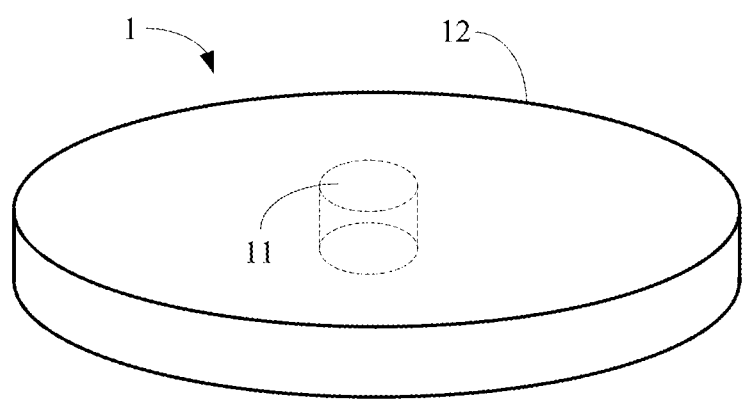
FIG. 4 illustrates a schematic structural diagram of a wireless charging base according to an exemplary embodiment.

In view of the above embodiment, a wireless charging base 1 as illustrated in FIG. 4 is further provided in the disclosure. The wireless charging base 1 may include a cylindrical magnet 11 and a shell 12. The cylindrical magnet 11 is disposed in the shell 12 and forms a magnetic field outside the shell 12. The cylindrical magnet 11 is disposed axially along a thickness of the wireless charging base 1. As illustrated in FIG. 4, the shell 12 may be a cylinder. In other embodiments, the shell 12 may also be other shapes, such as a cube, a cuboid, or an ellipsoid, which will not be specified in the disclosure.

In view of the above embodiment, an electronic device 2 is further provided in the disclosure. The electronic device 2 can cooperate with the wireless charging base 1 as illustrated in FIG. 4 to charge the electronic device 2 wirelessly. As illustrated in FIG. 2, FIG. 5, and FIG. 6, the electronic device 2 may include a charging coil component 22, a compass sensor 23, and a processor 24. The compass sensor 23 is configured to detect magnetic field intensities of a magnetic field generated by the cylindrical magnet 11 in a first direction and a second direction. The first direction is an axial direction of the cylindrical magnet 11, and the second direction is perpendicular to the first direction. The processor 24 is configured to determine, according to the magnetic field intensities in the first direction and the second direction detected by the compass sensor 23, a charging region adapted to the charging coil component 22. A point, at which the magnetic field intensity is zero in the first direction, is taken as a first point, and a point, at which the magnetic field intensity is zero in the second direction, is taken as a second point. The charging region is a circular region with the second point as a center of a circle, with a distance between the first point and the second point as a radius, and passing through the first point.

In view of this embodiment, due to the influence from a manufacturing process, three axes in the compass sensor 23 may not be orthogonal to one another, so non-orthogonal errors of the compass sensor 23 need to be corrected. After non-orthogonal coordinate system correction, the three axes in the compass sensor may be considered to be orthogonal to one another. However, when the compass sensor 23 is installed in the electronic device, due to installation errors, it is not necessarily ensured that a coordinate system of the compass sensor 23 is parallel to a coordinate system of the electronic device. Therefore, it is further needed to correct the installation errors of the data acquired by the compass sensor 23, to obtain the magnetic field intensity described in the above embodiment.

In an embodiment, the electronic device 2 may further include a back plate 21 and a magnetism isolation sheet 25. The magnetism isolation sheet 25 is located on one side of the charging coil component 22 away from the back plate 21, and the magnetism isolation sheet 25 is a circular sheet. The magnetism isolation sheet 3 may perform symmetric compression on the magnetic field generated by the cylindrical magnet 11, thereby reducing the influence of the magnetism isolation sheet 25 on the magnetic field, and being favorable for improving the accuracy of the magnetic field intensity detected by the compass sensor 23.

In another embodiment, the processor 24 may further correct the magnetic field having been through non-error correction and installation error correction, to obtain a first corrected magnetic field intensity in a first direction and a second corrected magnetic field intensity in a second direction. A point, at which the first corrected magnetic field intensity is zero, is taken as a first point, and a point, at which the second corrected magnetic field intensity is zero, is taken as a second point.

Specifically, the processor 24 may be configured to perform hard magnetic correction or soft magnetic correction on the detected magnetic field. Of course, in other embodiments, hard magnetic correction and soft magnetic correction may be performed on the magnetic field, which will not be specified in the disclosure. A particular correction solutions for hard magnetic correction and soft magnetic correction are as follows:

In an embodiment, when the magnetic field generated by the wireless charging base 1 is subjected to a constant magnetic field, hard magnetic correction may be performed. For example, when the electronic device 2 moves on the wireless charging base 1 in an 8-shaped movement track, the processor 24 may correct the magnetic field according to an extreme value of the detected magnetic field intensities in the first direction A and the second direction B. Specifically, when the electronic device 2 moves in an 8-shaped movement track, a maximum value and a minimum value of the magnetic field intensities in the first direction and the second direction are acquired and then, the magnetic field is corrected according to an average value of the maximum value and the minimum value.

In another embodiment, when the magnetic field generated by the wireless charging base 1 is subjected to a magnetic material or other magnetism isolation materials, soft magnetic correction may be performed. For example, the processor 24 may also perform ellipsoid fitting correction according to multiple groups of detected magnetic field intensities, each group including a detected magnetic field intensity in the first direction, a detected magnetic field intensity in the second direction and a detected magnetic field intensity in a third direction. The third direction is perpendicular to the first direction and the second direction.

Specifically, the soft magnetic correction is to correct an ellipsoidal magnetic field formed by compression due to the influence of external factors, into a regular spherical magnetic field. It can be understood that a regular ellipsoid comply with the following formula in a coordinate system of xyz-o:

$$(x-x_0)^2/a^2+(y-y_0)^2/b^2+(z-z_0)^2/c^2=R^2,$$

where a is a radius on an x axis, b is a radius on a y axis, c is a radius on a z axis, and R, $x_0$, $y_0$ and $z_0$ are constants.

The regular sphere may meet:

$$x^2+y^2+z^2=R^2,$$

where R is a radius.

Further, it may be assumed that the measured values detected by the compass sensor 23 are $[x_1, y_1, z_1]$, where $x_1$ is a magnetic field intensity on the x axis, $y_1$ is a magnetic field intensity on the y axis, and $z_1$ is a translation parameter on the z axis. It is assumed that the corrected values are $[x_2, y_2, z_2]$, where $x_2$ is the corrected magnetic field intensity on the x axis, $y_2$ is the corrected magnetic field intensity on the y axis, and $z_2$ is the corrected magnetic field intensity on the z axis. Further, it may be assumed that translation parameters between the ellipsoidal magnetic field and the spherical magnetic field are $[o_x, o_y, o_x]$, where $o_x$ is a translation parameter on the x axis, $o_y$ is a translation parameter on the y axis, and $o_z$ is a translation parameter on the z axis. It is assumed that scaling parameters are $[g_x, g_y, g_z]$, where $g_x$ is a scaling parameter on the x axis, $g_y$ is a scaling parameter on the y axis, and $g_z$ is a scaling parameter on the z axis, thereby obtaining:

$$x_2=[x_1+o_x]\times g_x;$$

$$y_2=[y_1+o_y]\times g_y;$$

$$z_2=[z_1+o_z]\times g_z.$$

The relationship between the measured values and the corrected values is substituted into the regular sphere formula to further solve $o_x, o_y, o_z, g_x, g_y$ and $g_z$ by means of derivation, a Gaussian elimination method, a least square method, etc. The solved $o_x, o_y, o_z, g_x, g_y$ and $g_z$ are substituted into the relationship between the measured values and the corrected values again to obtain the corrected values, thus completing the ellipsoid fitting correction.

With the corrected magnetic field obtained based on any one of the above modes, the first corrected magnetic field intensity in the first direction and the second corrected magnetic field intensity in the second direction may be obtained according to the relationship between the magnetic field before the correction and the magnetic field after the correction, and the detected magnetic field intensities. A point, at which the first corrected magnetic field intensity is zero, is taken as a first point, and a point, at which the second corrected magnetic field intensity is zero, is taken as a second point. A charging region is a circular region with the second point as a center of a circle, with a distance between the first point and the second point as a radius, and passing through the first point.

Based on the technical solution of the disclosure, a determining method for a charging region is further provided. The determining method is applied to an electronic device. The electronic device can cooperate with a wireless charging base to charge the electronic device wirelessly. The wireless charging base includes a cylindrical magnet disposed axially along a thickness of the wireless charging base, and the electronic device includes a charging coil component.

FIG. 7 illustrates a flow chart of a determining method for a charging region according to an exemplary embodiment. As illustrated in FIG. 7, the method is applied to a terminal and may include the following steps:

In step 601, magnetic field intensities of a magnetic field generated by the cylindrical magnet in a first direction and a second direction are acquired. The first direction is an axial direction of the cylindrical magnet, and the second direction is perpendicular to the first direction. In this embodiment, the magnetic field intensities in the first direction and the second direction may be acquired through the compass sensor 23. The first direction is an axial direction of the cylindrical magnet 11, and the second direction is perpendicular to the first direction. The second direction may be any radial direction of the cylindrical magnet 11, which will not be specified in the disclosure.

In step 602, a charging region formed by the cylindrical magnet and adapted to the charging coil component is determined according to the magnetic field intensities in the first direction and the second direction. A point, at which the magnetic field intensity is zero in the first direction, is taken as a first point, and a point, at which the magnetic field intensity is zero in the second direction, is taken as a second point. The charging region is a circular region with the second point as a center of a circle, with a distance between the first point and the second point as a radius, and passing through the first point.

In this embodiment, by detecting the magnetic field intensities in the first direction and the second direction, the first point at which the magnetic field intensity is zero in the first direction and the second point at which the magnetic field intensity is zero in the second direction can be determined. A radius of the charging region is determined according to the distance between the first point and the second point. A circular region passing through the first point is formed by taking the second point as a center of a circle. As such, the circular region is the charging region adapted to the charging coil component.

It can be understood that when the spaced distance between the compass sensor 23 and the cylindrical magnet 11 is different, the spaced distance between the first point and the second point will also be different. Specifically, the spaced distance between the compass sensor 23 and the cylindrical magnet 11 is inversely related with the spaced distance between the first point and the second point. That is to say, the larger the spaced distance between the compass sensor 23 and the cylindrical magnet 11, the smaller the corresponding charging region will be.

In the above embodiments, the determining method may further include the following step of correcting the detected magnetic field to obtain a first corrected magnetic field intensity in the first direction and a second corrected magnetic field intensity in the second direction. A point, at which the first corrected magnetic field intensity is zero, is taken as the first point, and a point, at which the second corrected magnetic field intensity is zero, is taken as the second point. Based on this, by correcting the magnetic field, the influence of an external magnetic field on the magnetic field generated by the cylindrical magnet may be reduced, and the accuracy of the alignment between the electronic device 2 and the wireless charging base 1 may be improved.

Specifically, the processor 24 of the electronic device may be further configured to perform hard magnetic correction or soft magnetic correction on the detected magnetic field. Of course, in other embodiments, hard magnetic correction and soft magnetic correction may be performed on the magnetic field, which will not be specified in the disclosure.

Specifically, in an embodiment, when the electronic device 2 moves on the wireless charging base 1 in an 8-shaped movement track, the processor 24 may correct the magnetic field according to an extreme value of the detected magnetic field intensities in the first direction A and the second direction B. Specifically, when the electronic device 2 moves in an 8-shaped movement track, a maximum value and a minimum value of the magnetic field intensities in the first direction and the second direction are acquired. Then, the magnetic field is corrected according to an average value of the maximum value and the minimum value.

In another embodiment, the processor 24 may further perform ellipsoid fitting correction according to multiple groups of detected magnetic field intensities, each group including a detected magnetic field intensity in the first direction, a detected magnetic field intensity in the second direction and a detected magnetic field intensity in a third direction. The third direction is perpendicular to the first direction and the second direction.

Specifically, the soft magnetic correction is to correct an ellipsoidal magnetic field formed by compression due to the influence of external factors, into a regular spherical magnetic field. It can be understood that a regular ellipsoid complies with the following formula:

$$(x-x_0)^2/a^2+(y-y_0)^2/b^2+(z-z_0)^2/c^2=R^2;$$

and a regular sphere may comply with:

$$x^2+y^2+z^2=R^2.$$

Further, it can be assumed that the measured values detected by the compass sensor 23 are $[x_1, y_1, z_1]$, and the corrected values are $[x_2, y_2, z_2]$. It can be further assumed that translation parameters between the ellipsoidal magnetic field and the spherical magnetic field are $[o_x, o_y, o_x]$, and scaling parameters are $[g_x, g_y, g_z]$, thereby obtaining:

$$x_2=[x_1+o_x]\times g_x;$$

$$y_2=[y_1+o_y]\times g_y;$$

$$z_2=[z_1+o_z]\times g_z.$$

The relationship between the measured values and the corrected values is substituted into the regular sphere formula to further solve $o_x$, $o_y$, $o_z$, $g_x$, $g_y$ and $g_z$ by means of derivation, a Gaussian elimination method, a least square method, etc. The solved $o_x$, $o_y$, $o_z$, $g_x$, $g_y$ and $g_z$ are substituted into the relationship between the measured values and the corrected values again to obtain the corrected values, thus completing the ellipsoid fitting correction.

Corresponding to the aforementioned embodiments of the determining method for a charging region, embodiments of a determining device for a charging region is further provided in the disclosures.

Figure 8:
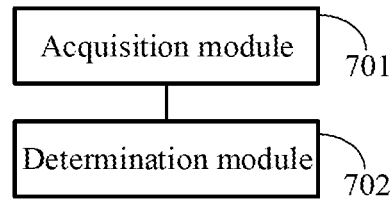
FIG. 8 illustrates a block diagram of a determining device for a charging region according to an exemplary embodiment.

FIG. 8 illustrates a block diagram of a determining device for a charging region according to an exemplary embodiment. The determining device is applied to an electronic device. The electronic device may cooperate with a wireless charging base to charge the electronic device wirelessly. The wireless charging base includes a cylindrical magnet disposed axially along a thickness of the wireless charging base. The electronic device includes a charging coil component.

As illustrated in FIG. 8, the determining device includes an acquisition module 701 and a determination module 702. The acquisition module 701 can be configured to acquire magnetic field intensities of a magnetic field generated by the cylindrical magnet in a first direction and a second direction. The first direction is an axial direction of the cylindrical magnet, and the second direction is perpendicular to the first direction.

The determination module 702 can be configured to determine, according to the magnetic field intensities in the first direction and the second direction, a charging region formed by the cylindrical magnet and adapted to the charging coil component. A point, at which the magnetic field intensity is zero in the first direction, is taken as a first point, and a point, at which of the magnetic field intensity is zero in the second direction, is taken as a second point. The charging region is a circular region with the second point as a center of a circle, with a distance between the first point and the second point as a radius, and passing through the first point.

Figure 9:
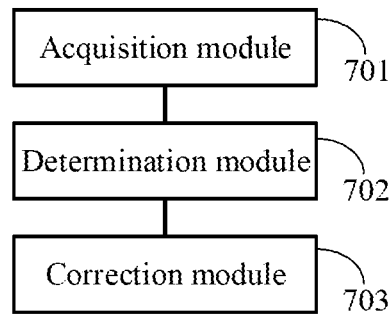
FIG. 9 illustrates a block diagram of another determining device for a charging region according to an exemplary embodiment.

FIG. 9 illustrates a block diagram of another determining device for a charging region according to an exemplary embodiment. In this embodiment, on the basis of the above embodiment as illustrated in FIG. 8, the determining device may further include a correction module 703.

The correction module 703 can be configured to correct the detected magnetic field to obtain a first corrected magnetic field intensity in the first direction and a second corrected magnetic field intensity in the second direction. A point, at which the first corrected magnetic field intensity is zero, is taken as the first point, and a point, at which the second corrected magnetic field intensity is zero, is taken as the second point.

Figure 10:
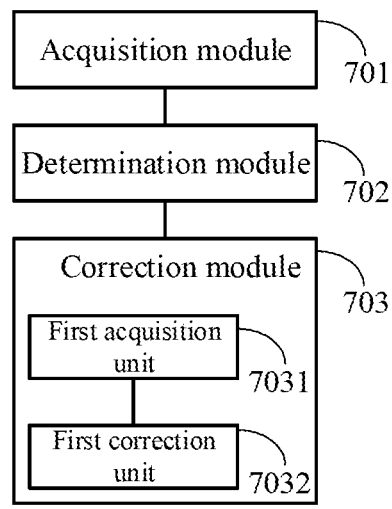
FIG. 10 illustrates a block diagram of a further determining device for a charging region according to an exemplary embodiment.

FIG. 10 illustrates a block diagram of another determining device for a charging region according to an exemplary embodiment. In this embodiment, on the basis of the above embodiment as illustrated in FIG. 9, the correction module 703 may include a first acquisition unit 7031 and a first correction unit 7032.

The first acquisition unit 7031 can be configured to acquire an extreme value of the magnetic field intensities in the first direction and the second direction, when the electronic device moves on the wireless charging base in an 8-shaped movement track.

The first correction unit 7032 can be configured to correct the magnetic field according to the extreme value of the magnetic field intensities in the first direction and the second direction.

Figure 11:
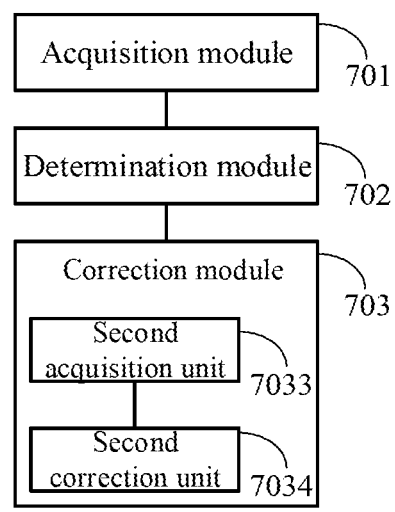
FIG. 11 illustrates a block diagram of a yet further determining device for a charging region according to an exemplary embodiment.

FIG. 11 illustrates a block diagram of another determining device for a charging region according to an exemplary embodiment. In this embodiment, on the basis of the above embodiment as illustrated in FIG. 9, the correction module 703 may include a second acquisition unit 7033 and a second correction unit 7034.

The second acquisition unit 7033 can be configured to acquire multiple groups of magnetic field intensities, each group including a magnetic field intensity in the first direction, a magnetic field intensity in the second direction and a magnetic field intensity in a third direction. The third direction is perpendicular to the first direction and the second direction.

The second correction unit 7034 can be configured to correct the magnetic field according to the multiple groups of magnetic field intensities and an ellipsoid fitting correction algorithm.

In the device of the above embodiments, the particular mode of each module executing an operation has been described in detail in the embodiments related to the method and will not be described in detail herein.

Since the device embodiments substantially correspond to the method embodiments, the description in the method embodiments can be referred to for related parts. The device embodiments described above are only exemplary. The units described as separate components may be or may not be physically separated, and the components displayed as units may be or may not be physical units, may be located in one place, or may be distributed on multiple network units. Some or all of the modules may be selected according to actual needs to achieve the objectives of the solution of the disclosure, and can be understood and practiced by those skilled in the art without any creative effort.

Correspondingly, a determining device for a charging region, applied to an electronic device is further provided in the disclosure. The electronic device can cooperate with a wireless charging base to charge the electronic device wirelessly. The wireless charging base includes a cylindrical magnet disposed axially along a thickness of the wireless charging base. The electronic device includes: a charging coil component, a processor, and a memory configured to store processor-executable instructions. The processor is configured to acquire magnetic field intensities of a magnetic field generated by the cylindrical magnet in a first direction and a second direction. The first direction is an axial direction of the cylindrical magnet, and the second direction is perpendicular to the first direction. The processor is further configured to determine, according to the magnetic field intensities in the first direction and the second direction, a charging region formed by the cylindrical magnet and adapted to the charging coil component. A point, at which the magnetic field intensity is zero in the first direction, is taken as a first point, and a point, at which the magnetic field intensity is zero in the second direction, is taken as a second point. The charging region is a circular region with the second point as a center of a circle, with a distance between the first point and the second point as a radius, and passing through the first point.

Correspondingly, further provided in the disclosure is a terminal that can cooperate with a wireless charging base to charge the electronic device wirelessly. The wireless charging base includes a cylindrical magnet disposed axially along a thickness of the wireless charging base. The electronic device includes a charging coil component. The terminal includes a memory, and one or more programs stored in the memory. Instructions, included in one or more programs, for performing the following operations are executed by one or more processors. Magnetic field intensities of a magnetic field generated by the cylindrical magnet in a first direction and a second direction are acquired. The first direction is an axial direction of the cylindrical magnet, and the second direction is perpendicular to the first direction. A charging region formed by the cylindrical magnet and adapted to the charging coil component is determined according to the magnetic field intensities in the first direction and the second direction. A point, at which the magnetic field intensity is zero in the first direction, is taken as a first point, and a point at which the magnetic field intensity is zero in the second direction, is taken as a second point. The charging region is a circular region with the second point as a center of a circle, with a distance between the first point and the second point as a radius, and passing through the first point.

Figure 12:
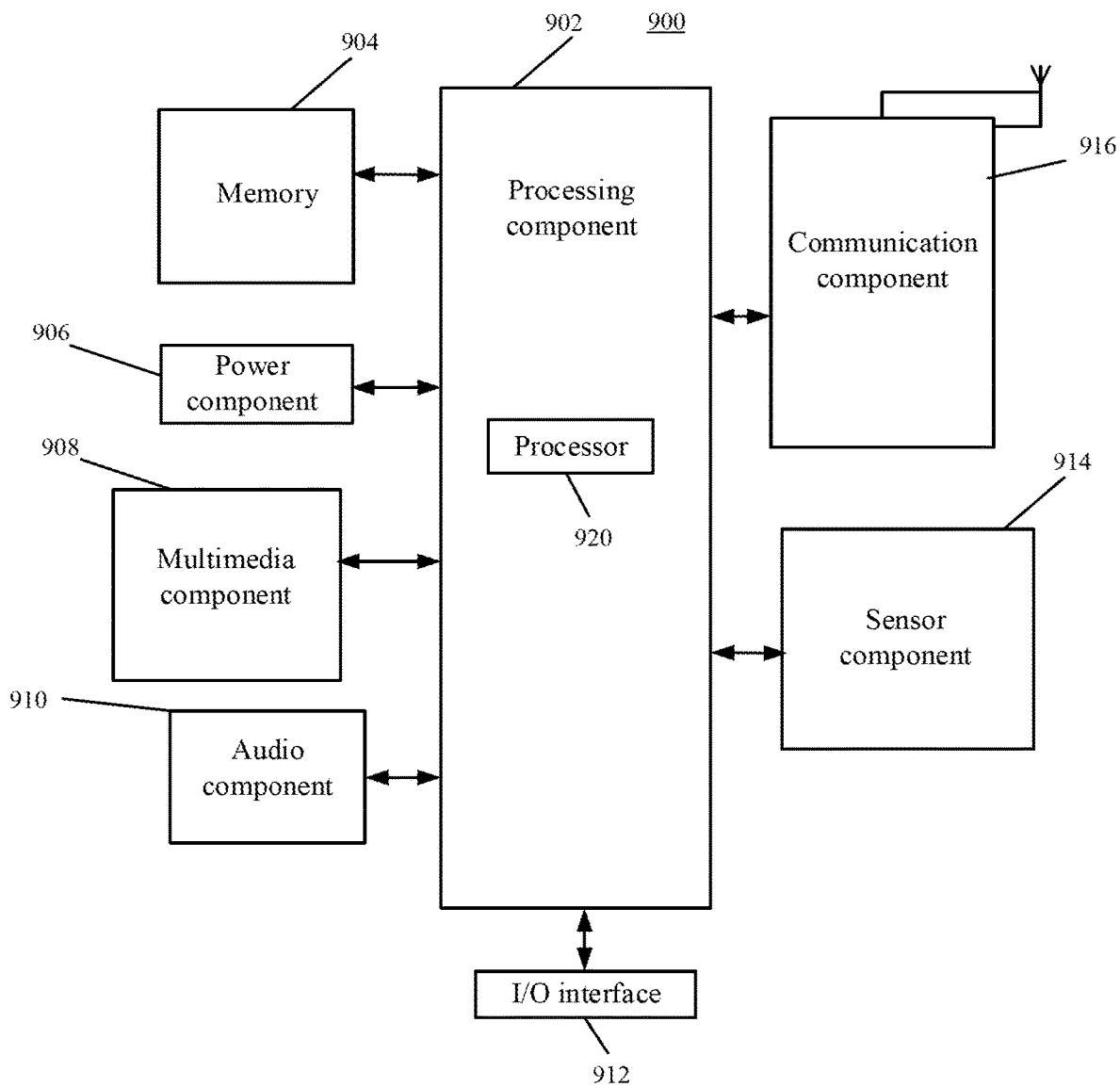
FIG. 12 illustrates a block diagram of a determining device for a charging region according to an exemplary embodiment.

FIG. 12 illustrates a block diagram of a determining device 900 of a charging region according to an exemplary embodiment. For example, the device 900 may be a mobile phone, a computer, a digital broadcast terminal, a messaging device, a gaming console, a tablet device, a medical device, exercise equipment, a personal digital assistant, and the like.

As illustrated in FIG. 12, the device 900 may include one or more of the following components: a processing component 902, a memory 904, a power component 906, a multimedia component 908, an audio component 910, an Input/Output (I/O) interface 912, a sensor component 914, and a communication component 916.

The processing component 902 typically controls the overall operation of the device 900, such as operations associated with display, telephone calls, data communications, camera operations, and recording operations. The processing component 902 may include one or more processors 920 to execute instructions to perform all or some of the steps in the above described methods. Moreover, the processing component 902 may include one or more modules which facilitate the interaction between the processing component 902 and other components. For instance, the processing component 902 may include a multimedia module to facilitate the interaction between the multimedia component 908 and the processing component 902.

The memory 904 is configured to store various types of data to support the operation of the device 900. Examples of such data include instructions for any applications or methods operated on the device 900, contact data, phone book data, messages, pictures, videos, etc. The memory 904 may be implemented using any type of volatile or non-volatile memory devices, or a combination thereof, such as a Static Random Access Memory (SRAM), an Electrically Erasable Programmable Read-Only Memory (EEPROM), an Erasable Programmable Read-Only Memory (EPROM), a Programmable Read-Only Memory (PROM), a Read-Only Memory (ROM), a magnetic memory, a flash memory, a magnetic disk or an optical disk.

The power component 906 provides power to various components of the device 900. The power component 906 may include a power management system, one or more power sources, and any other components associated with the generation, management, and distribution of power in the device 900.

The multimedia component 908 includes a screen providing an output interface between the device 900 and a user. In some embodiments, the screen may include a Liquid Crystal Display (LCD) and a Touch Panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but further sense a period of time and a pressure associated with the touch or swipe action. In some embodiments, the multimedia component 908 includes a front camera and/or a rear camera. The front camera and/or the rear camera may receive external multimedia data while the device 900 is in an operating mode, such as a photographing mode or a video mode. Each of the front camera and the rear camera may be a fixed optical lens system or have focus and optical zoom capability.

The audio component 910 is configured to output and/or input audio signals. For example, the audio component 910 includes a microphone (MIC) configured to receive an external audio signal when the device 900 is in an operating mode, such as a call mode, a recording mode, and a voice recognition mode. The received audio signal may be further stored in the memory 904 or transmitted via the communication component 916. In some embodiments, the audio component 910 further includes a speaker to output audio signals.

The I/O interface 912 provides an interface between the processing component 902 and peripheral interface modules, such as a keyboard, a click wheel, buttons, and the like. The buttons may include, but are not limited to, a home button, a volume button, a start button, and a lock button.

The sensor component 914 includes one or more sensors configured to provide status assessments in various aspects for the device 900. For instance, the sensor component 914 may detect an on/off status of the device 900, relative positioning of the components, e.g., the display and the keypad, of the device 900. The sensor component 914 may further detect a change in position of the device 900 or a component of the device 900, presence or absence of contact between the user and the device 900, an orientation or an acceleration/deceleration of the device 900, and a change in temperature of the device 900. The sensor component 914 may include a proximity sensor configured to detect presence of an object nearby without any physical contact. The sensor component 914 may also include a light sensor, such as a Complementary Metal Oxide Semiconductor (CMOS) or Charge Coupled Device (CCD) image sensor, configured for use in an imaging application. In some embodiments, the sensor component 914 may further include an acceleration sensor, a gyroscope sensor, a magnetic sensor, a pressure sensor, or a temperature sensor.

The communication component 916 is configured to facilitate wired or wireless communication between the device 900 and another device. The device 900 may access a communication-standard-based wireless network, such as a Wireless Fidelity (WiFi) network, a 2nd-Generation (2G) or 5th-Generation (5G) network or a combination thereof. In some embodiments, the communication component 916 receives a broadcast signal or broadcast associated information from an external broadcast management system through a broadcast channel. In some embodiments, the communication component 916 further includes a Near Field Communication (NFC) module to facilitate short-range communication. For example, the NFC module may be implemented based on a Radio Frequency Identification (RFID) technology, an Infrared Data Association (IrDA) technology, an Ultra-WideBand (UWB) technology, a Bluetooth (BT) technology and another technology In some embodiments, the device 900 may be implemented by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), controllers, micro-controllers, microprocessors or other electronic components, and is configured to execute the abovementioned method.

In exemplary embodiments, there is also provided a non-transitory computer-readable storage medium including instructions, such as the memory 904 including an instruction, and the instruction may be executed by the processor 920 of the device 900 to implement the abovementioned method. For example, the non-transitory computer-readable storage medium may be a ROM, a Compact Disc Read-Only Memory (CD-ROM), a magnetic tape, a floppy disc, an optical data storage device and the like.

In the disclosure, it is to be understood that the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features can be described above as acting in certain combinations and even initially claimed as such, one or more features from a claimed combination can in some cases be excised from the combination, and the claimed combination can be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

Other implementations of the disclosure will be apparent to those skilled in the art from consideration of the specification and practice of the disclosure here. The disclosure is intended to cover any variations, uses, or adaptations of the disclosure following the general principles thereof and including such departures from the disclosure as come within known or customary practice in the art. It is intended that the specification and embodiments be considered as exemplary only, with a true scope and spirit of the disclosure being indicated by the following claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. An electronic device capable of being wirelessly charged by a wireless charging base having a cylindrical magnet, wherein the electronic device comprises:
a charging coil component;

a compass sensor that is configured to detect magnetic field intensities of a magnetic field generated by the cylindrical magnet in a first direction that is an axial direction of the cylindrical magnet and a second direction that is perpendicular to the first direction; and a processor that is configured to determine, according to the magnetic field intensities in the first direction and the second direction detected by the compass sensor, a charging region adapted to the charging coil component, wherein the processor is further configured to:
when the electronic device moves on the wireless charging base in an 8-shaped movement track, correct the magnetic field according to an extreme value of the detected magnetic field intensities in the first direction and the second direction, to obtain a first corrected magnetic field intensity in the first direction and a second corrected magnetic field intensity in the second direction, wherein a point, at which the first corrected magnetic field intensity is zero, is taken as a first point, and a point, at which the second corrected magnetic field intensity is zero, is taken as a second point, and the charging region is a circular region with the second point as a center of a circle, with a distance between the first point and the second point as a radius, and passing through the first point.

2. The electronic device of claim 1, further comprising:
a back plate; and
a magnetism isolation sheet that is a circular sheet located on one side of the charging coil component away from the back plate.

3. The electronic device of claim 1, wherein the processor is configured to perform ellipsoid fitting correction according to multiple groups of detected magnetic field intensities, each group including a detected magnetic intensity in the first direction, a detected magnetic intensity in the second direction, and a detected magnetic intensity a third direction, wherein the third direction is perpendicular to the first direction and the second direction.

4. A method for determining a charging region, applied to an electronic device cooperating with a wireless charging base to wirelessly charge the electronic device through the wireless charging base, the wireless charging base having a cylindrical magnet disposed axially along a thickness of the wireless charging base, and the electronic device having a charging coil component, wherein the method comprises:
acquiring magnetic field intensities of a magnetic field generated by the cylindrical magnet in a first direction and a second direction, wherein the first direction is an axial direction of the cylindrical magnet and the second direction is perpendicular to the first direction; and
determining, according to the magnetic field intensities in the first direction and the second direction, a charging region adapted to the charging coil component,
wherein the method further comprises:
acquiring an extreme value of the magnetic field intensities in the first direction and the second direction, when the electronic device moves on the wireless charging base in an 8-shaped movement track;
correcting the magnetic field according to the extreme value of the magnetic field intensities in the first direction and the second direction, to obtain a first corrected magnetic field intensity in the first direction and a second corrected magnetic field intensity in the second direction; and taking a point, at which the first corrected magnetic field intensity is zero, as a first point, and a point, at which the second corrected magnetic field intensity is zero, as a second point, the charging region being a circular region with the second point as a center of a circle, with a distance between the first point and the second point as a radius, and passing through the first point.

5. The method of claim 4, wherein the method further comprises:
acquiring multiple groups of magnetic field intensities, each group including a magnetic field intensity in the first direction, a magnetic field intensity in the second direction, and a magnetic field intensity in a third direction, wherein the third direction is perpendicular to the first direction and the second direction; and
correcting the magnetic field according to the multiple groups of magnetic field intensities and an ellipsoid fitting correction algorithm.

6. A non-transitory computer-readable storage medium with computer instructions stored thereon, wherein the instructions, when executed by a processor, implement the steps of the method of claim 4.

7. The non-transitory computer-readable storage medium of claim 6, wherein the method further comprises:
acquiring multiple groups of magnetic field intensities, each group including a magnetic field intensity in the first direction, a magnetic field intensity in the second direction and a magnetic field intensity in a third direction, wherein the third direction is perpendicular to the first direction and the second direction; and
correcting the magnetic field according to the multiple groups of magnetic field intensities and an ellipsoid fitting correction algorithm.

8. An electronic device having a processor and a memory that is configured to store processor-executable instructions that, when executed by the processor, cause the processor to:
acquire magnetic field intensities of a magnetic field generated by a cylindrical magnet of a wireless charging base in a first direction and a second direction, wherein the first direction is an axial direction of the cylindrical magnet, and the second direction is perpendicular to the first direction; and
determine, according to the magnetic field intensities in the first direction and the second direction, a charging region adapted to a charging coil component,
wherein the processor is further configured to:
acquire an extreme value of the magnetic field intensities in the first direction and the second direction when the electronic device moves on the wireless charging base in an 8-shaped movement track;
correct the magnetic field according to the extreme value of the magnetic field intensities in the first direction and the second direction, to obtain a first corrected magnetic field intensity in the first direction and a second corrected magnetic field intensity in the second direction; and
take a point, at which the first corrected magnetic field intensity is zero, as a first point, and a point, at which the second corrected magnetic field intensity is zero, as a second point, the charging region being a circular region with the second point as a center of a circle, with a distance between the first point and the second point as a radius, and passing through the first point.

9. The electronic device of claim 8, wherein the processor is further configured to:

acquire multiple groups of magnetic field intensities, each group including a magnetic field intensity in the first direction, a magnetic field intensity in the second direction and a magnetic field intensity in a third direction, wherein the third direction is perpendicular to the first direction and the second direction; and correct the magnetic field according to the multiple groups of magnetic field intensities and an ellipsoid fitting correction algorithm.

\* \* \* \* \*